US009285808B2

(12) United States Patent
Tuten et al.

(10) Patent No.: US 9,285,808 B2
(45) Date of Patent: Mar. 15, 2016

(54) ADAPTIVE SWITCHING VOLTAGE REGULATOR

(71) Applicant: QUALCOMM Incorporated, San Diego, CA (US)

(72) Inventors: Charles Derrick Tuten, Scottsdale, AZ (US); Marko H Koski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 363 days.

(21) Appl. No.: 13/785,705

(22) Filed: Mar. 5, 2013

(65) Prior Publication Data

US 2014/0253059 A1   Sep. 11, 2014

(51) Int. Cl.
*G05F 1/10* (2006.01)
*H02M 1/00* (2007.01)
*G05F 1/56* (2006.01)
*G05F 1/46* (2006.01)

(52) U.S. Cl.
CPC . *G05F 1/10* (2013.01); *H02M 1/00* (2013.01); *G05F 1/462* (2013.01); *G05F 1/56* (2013.01)

(58) Field of Classification Search
CPC ........... G05F 1/10; G05F 1/462; G05F 1/466; G05F 1/56
USPC .......................... 323/222–225, 268, 271, 282
See application file for complete search history.

(56) References Cited

U.S. PATENT DOCUMENTS

| 6,191,630 | B1 * | 2/2001 | Ozawa et al. | 327/278 |
|---|---|---|---|---|
| 7,456,623 | B2 * | 11/2008 | Hasegawa et al. | 323/285 |
| 7,714,549 | B2 * | 5/2010 | Takemura | 323/244 |
| 7,737,671 | B2 * | 6/2010 | Figoli | 323/282 |
| 8,164,320 | B2 | 4/2012 | Latham, II et al. | |
| 2008/0218133 | A1 * | 9/2008 | Kuan | 323/234 |
| 2008/0309302 | A1 | 12/2008 | Chen et al. | |
| 2011/0175582 | A1 * | 7/2011 | Latham et al. | 323/271 |
| 2012/0043950 | A1 | 2/2012 | Truong et al. | |

OTHER PUBLICATIONS

Chuang, et al., "An efficient fast response hysteresis buck converter with adaptive synthetic ripple modulator", (2011), 8th International Conference on Power Electronics—ECCE Asia, pp. 620-627, Doi: 10.1109/ICPE.2011.5944622, See section H, pp. 624-625.

Kong, et al., "Design of a synchronous-rectified buck bootstrap MOSFET driver for voltage regulator module", (2007), 7th International Conference on ASIC, pp. 974-977, Doi: 10.1109/ICASIC.2007.4415795, See Section 2.2, pp. 975-976.

* cited by examiner

*Primary Examiner* — Matthew Nguyen
(74) *Attorney, Agent, or Firm* — Arent Fox LLP

(57) ABSTRACT

Exemplary embodiments are related to a switching voltage regulator. A device may include a first transistor having a gate configured to receive a first signal and a second transistor having a gate configured to receive a second signal. The device may also include a controller configured to measure at least one of a difference between a rising edge of the first signal and an associated rising edge of the second signal and a difference between a falling edge of the first signal and an associated falling edge of the second signal. The controller may also be configured to delay one of the first signal and the second signal if the rising edge of the first signal occurs before or after the associated rising edge of the second signal or if the falling edge of the first signal occurs before or after the associated falling edge of the second signal.

20 Claims, 13 Drawing Sheets

ADAPTIVE SWITCHING VOLTAGE REGULATOR

BACKGROUND

1. Field

The present invention relates generally to adaptive switching voltage regulators. More specifically, the present invention relates to embodiments for dynamically delaying one or more signals in an adaptive switching voltage regulator to reduce overlaps and non-overlaps of switching elements.

2. Background

An electronic device, such as a mobile telephone, may include a voltage regulator that receives an input voltage from a power supply and generates an output voltage for a load. An integrated circuit may include a voltage regulator for providing a stable voltage reference for on-chip components such as a digital component, an analog component, and/or a radio-frequency (RF) component.

A voltage regulator may comprise a switching voltage regulator, which rapidly switches a power transistor between saturation (i.e., completely on) and cutoff (i.e., completely off) with a variable duty cycle. A resulting rectangular waveform is low pass filtered in order to produce a nearly constant output voltage proportional to the average value of the duty cycle. One advantage of a switching voltage regulator compared to a linear voltage regulator is greater efficiency because the switching transistor dissipates little power as heat in either a saturated state or a cutoff state.

As understood by a person having ordinary skill in the art, a switching voltage regulator, which includes two switches (i.e., a top field-effect transistor (FET) and a bottom FET), may experience overlaps (i.e., when both switches are "on") or non-overlaps (i.e., when neither switch is "on"). An "overlap" couples a battery directly to a ground voltage and, thus, energy is wasted. A "non-overlap," causes undesirable "ringing". Further, conventional voltage regulators, which switch the two switches coincidentally to attempt to minimize overlaps and non-overlaps, may experience overlaps and/or non-overlaps due to variable operating conditions (e.g., voltage or temperature).

A need exists for an enhanced switching voltage regulator. More specifically, a need exists for embodiments related to adaptive switching voltage regulator for dynamically adjusting one or more delays in an adaptive switching voltage regulator to reduce overlaps and non-overlaps.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Conventional switching voltage regulators, which include two switches (e.g., two transistors), may attempt to switch the two switches coincidentally to ensure that neither overlaps nor non-overlaps occur. However, because conventional switching voltage regulators are not configured to adapt to changes in operating conditions (e.g., voltage and/or temperature variations), the timing of one or more of the switches (i.e., transitioning from on to off, or vice versa) may be affected, resulting in overlaps and/or non-overlaps. Stated another way, variations in operating conditions may cause undesirable overlaps and/or non-overlaps in conventional switching voltage regulators.

Figure 1:
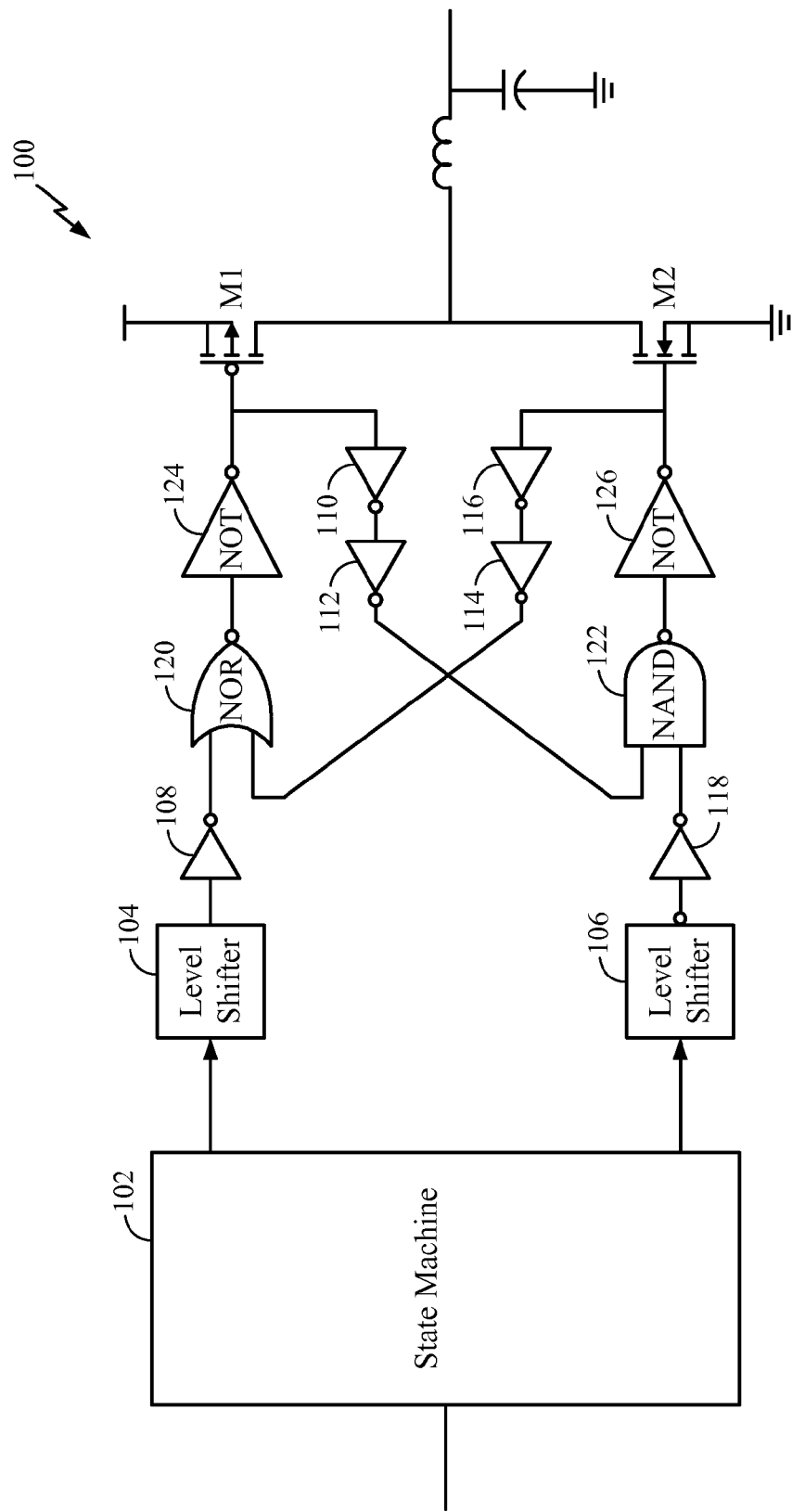
FIG. 1 illustrates a switching voltage regulator.

FIG. 1 illustrates a switching voltage regulator 100 including a first field-effect transistor (FET) M1 and a second FET M2. Switching voltage regulator 100 further includes state machine 102, level shifters 104 and 106, inverters 108, 110, 112, 114, 116, 118, 124, and 126, NOR gate 120, and NAND gate 122. Ideally, first FET M1 turns "on" at the same time as second FET M2 turns "off" and first FET M1 turns "off" at the same time as second FET M2 turns "on". However, as will be appreciated by a person having ordinary skill in the art, due to the configuration of switching voltage regulator 100, which requires a signal that is conveyed to FET M1 to turn FET M1 OFF to be conveyed through inverters 110 and 112, NAND gate 122, and inverter 126 before FET M2 is turned ON. Therefore, a non-overlap exists between FET M1 being turned OFF and FET M2 being turned ON. Similarly, a non-overlap exists between FET M2 being turned OFF and FET M1 being turned ON.

Figure 2:
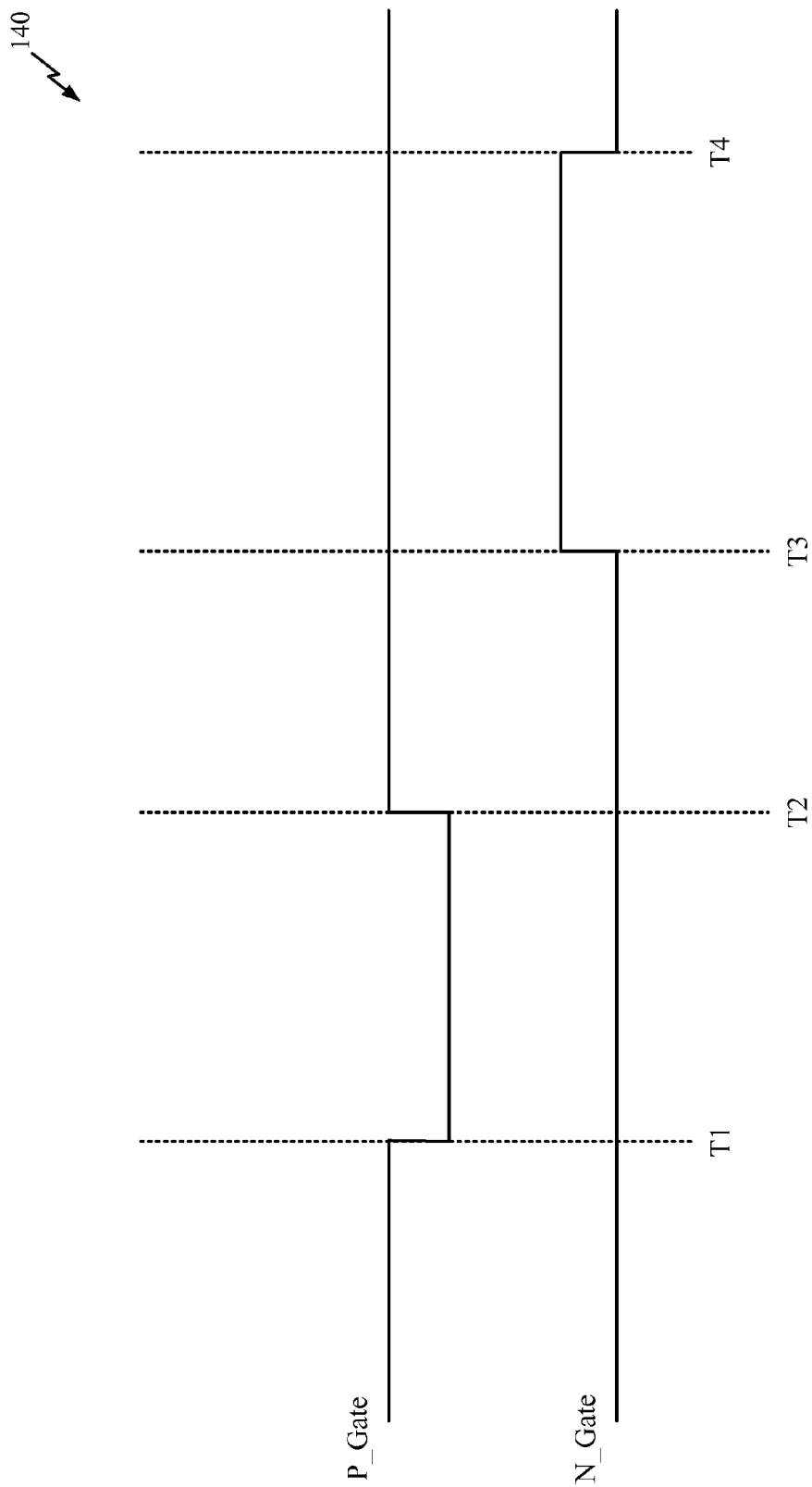
FIG. 2 depicts a timing diagram associated with the switching voltage regulator of FIG. 1.

FIG. 2 is a timing diagram 140 illustrating gate voltages of FETs M1 and M2 of switching voltage regulator 100. As illustrated in timing diagram 140, a gate voltage of FET M2 (i.e., N_Gate) is "low" until time T3. Therefore, FET M2 is in a non-conductive state until time T3. Further, at time T2, a gate voltage of FET M1 (i.e., P_Gate) goes "high" and, thus, FET M1 transitions to a non-conductive state at time T2. Accordingly, a non-overlap exists between time T2 and time T3. Further, it is noted that non-overlaps occur prior to time T1 and subsequent to time T4.

Figure 3:
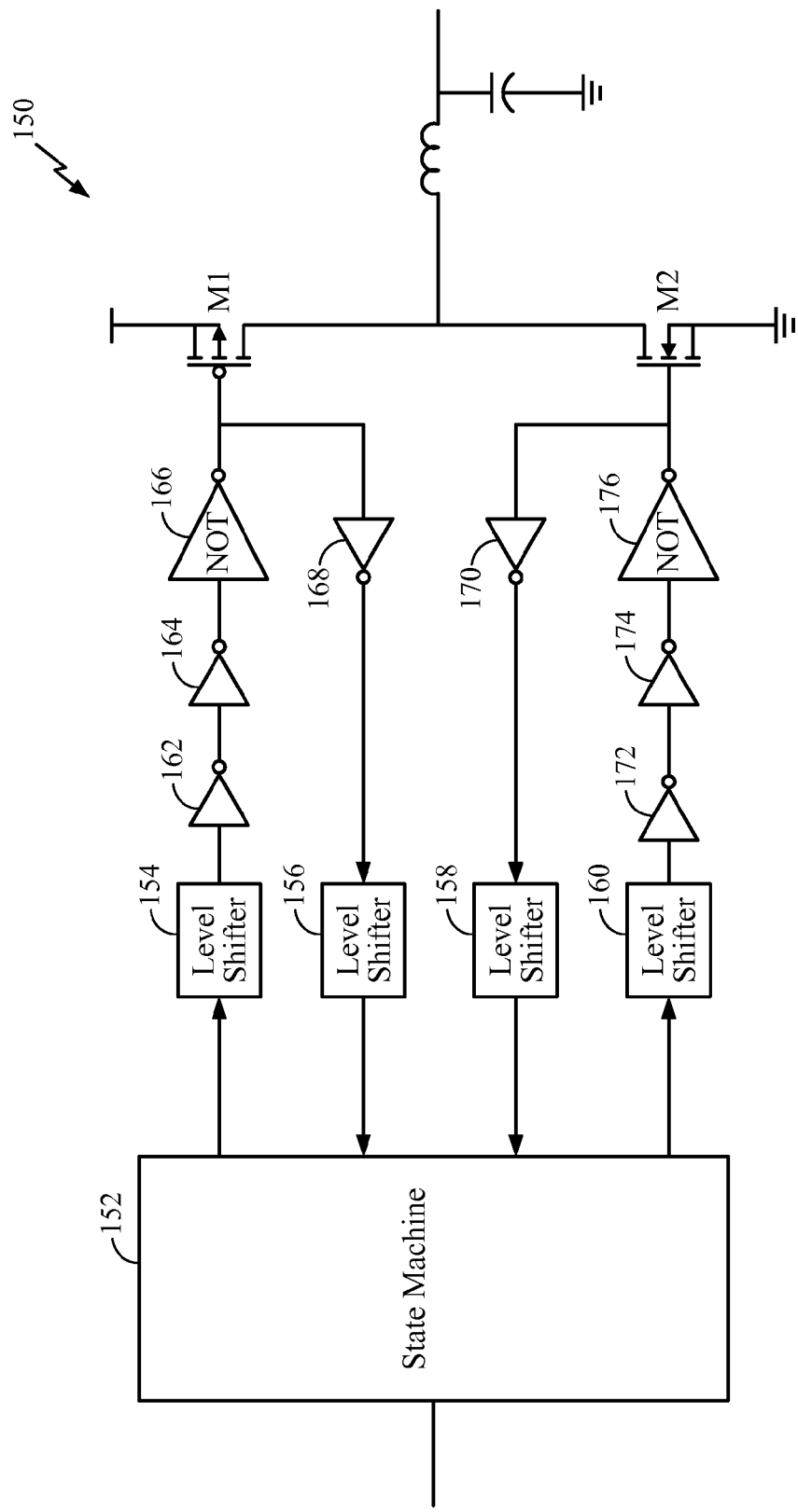
FIG. 3 illustrates another switching voltage regulator.

FIG. 3 illustrates another switching voltage regulator 150 including FET M1 and FET M2. Switching voltage regulator 150 further includes state machine 152, level shifters 154, 156, 158 and 160, and inverters 162, 164, 166, 168, 170, 172, 174, and 176. As will be appreciated by a person having ordinary skill in the art, due to the configuration of switching voltage regulator 150, which requires a signal that is conveyed to FET M1 to turn FET M1 OFF to be conveyed through inverters 168, level shifter 156, state machine 152, level shifter 160, inverters 172, 174, and 176 before FET M2 is turned ON. Therefore, a non-overlap exists between FET M1 being turned OFF and FET M2 being turned ON. Similarly, a non-overlap exists between FET M2 being turned OFF and FET M1 being turned ON.

Figure 4:
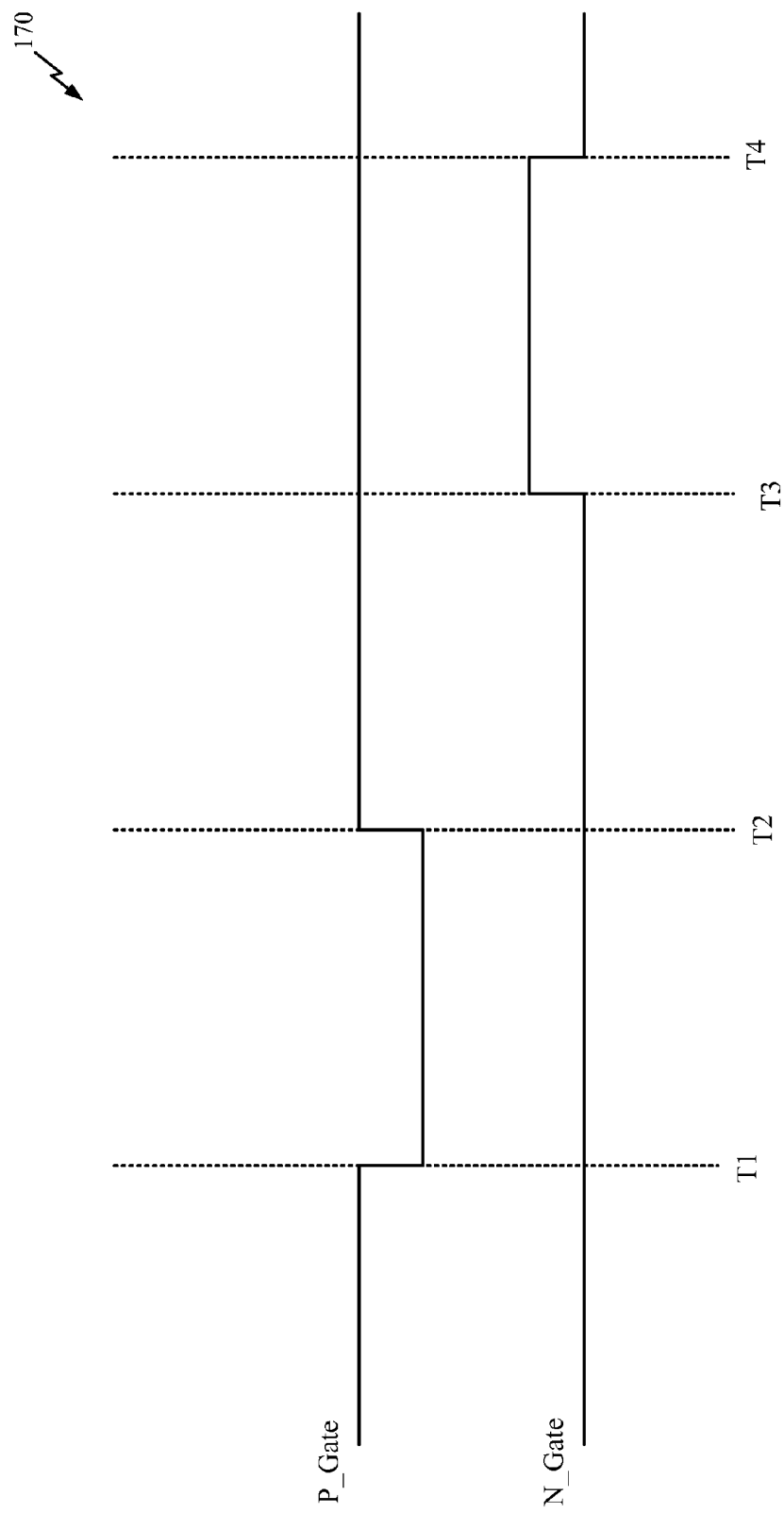
FIG. 4 depicts a timing diagram associated with the switching voltage regulator of FIG. 3.

FIG. 4 is a timing diagram 170 illustrating gate voltages of FETs M1 and M2 of switching voltage regulator 150. As illustrated in timing diagram 170, a gate voltage of FET M2 (i.e., N_Gate) is "low" until time T3. Therefore, FET M2 is in a non-conductive state until time T3. Further, at time T2, a gate voltage of FET M1 (i.e., P_Gate) goes "high" and, thus, FET M1 transitions to a non-conductive state at time T2. Accordingly, a non-overlap exists between time T2 and time T3. Further, it is noted that non-overlaps occur prior to time T1 and subsequent to time T4.

Exemplary embodiments, as described herein, are directed to devices, systems, and methods for dynamically adjusting one or more delays in an adaptive switching voltage regulator to reduce overlaps and non-overlaps. According to one exemplary embodiment, a device may include a first transistor having a gate configured to receive a first signal and a second transistor having a gate configured to receive a second signal. The device may also include a controller configured to measure at least one of a difference between a rising edge of the first signal and an associated rising edge of the second signal and a difference between a falling edge of the first signal and an associated falling edge of the second signal. The controller may also be configured to delay one of the first signal and the second signal if the rising edge of the first signal occurs before or after the associated rising edge of the second signal or if the falling edge of the first signal occurs before or after the associated falling edge of the second signal.

According to another exemplary embodiment, the present invention includes methods for operating a switching voltage regulator. Various embodiments of such a method may include measuring a difference between at least one of a rising edge of a first signal applied to a gate of a first transistor and an associated rising edge of a second signal applied to a gate of a second transistor and a falling edge of the first signal and an associated falling edge of the second signal. The method may also include delaying one of the first signal and the second signal if the rising edge of the first signal occurs before or after the associated rising edge of the second signal or if the falling edge of the first signal occurs before or after the associated falling edge of the second signal.

Other aspects, as well as features and advantages of various aspects, of the present invention will become apparent to those of skill in the art though consideration of the ensuing description, the accompanying drawings and the appended claims.

Figure 5:
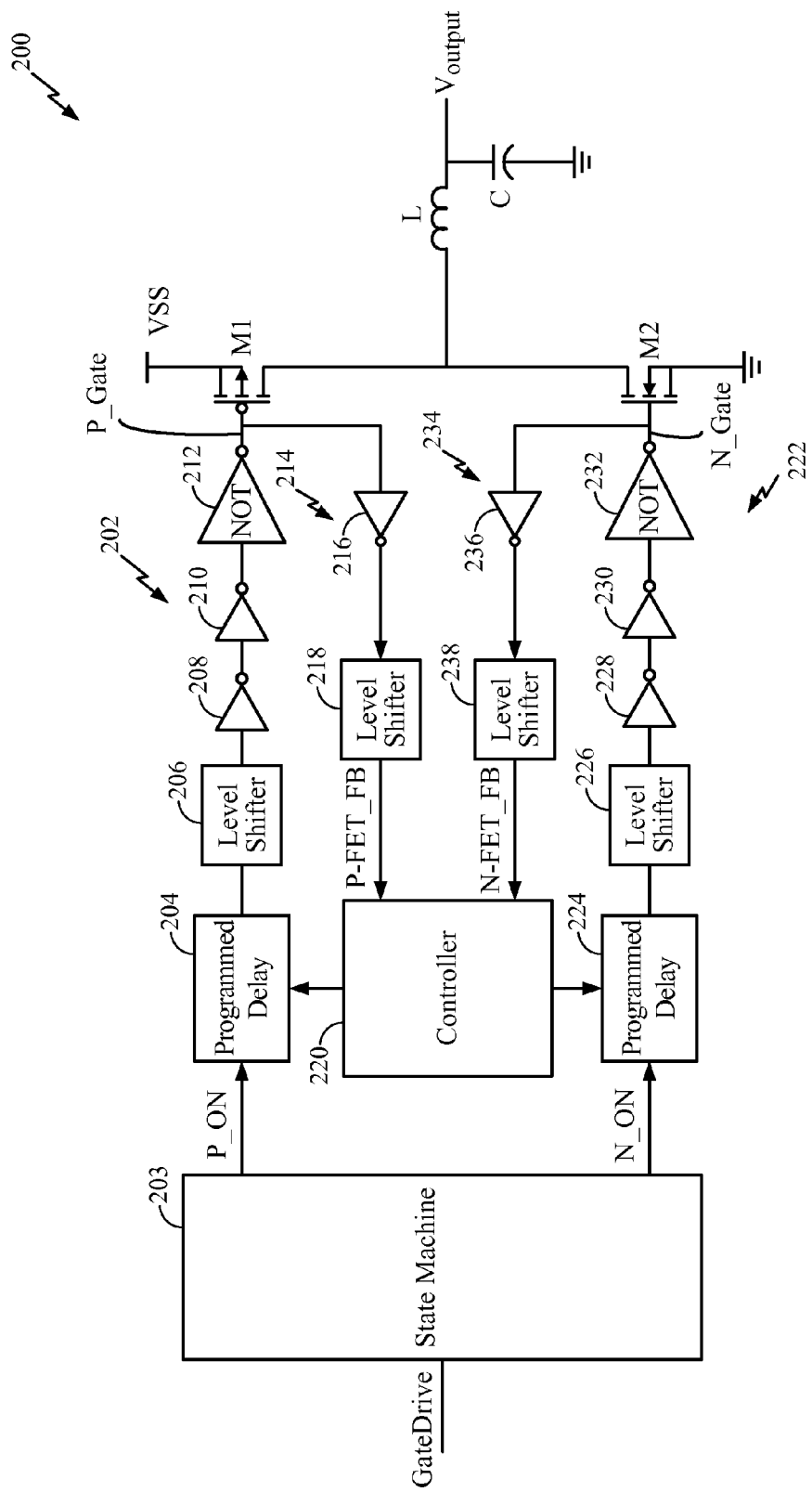
FIG. 5 depicts a switching voltage regulator including a controller for dynamically adjusting one or more signals to minimize overlaps and/or non-overlaps, according to an exemplary embodiment of the present invention.

FIG. 5 is a block diagram depicting a switching voltage regulator 200, according to an embodiment of the invention. Voltage regulator 200 includes a forward path 202 including a state machine 203, a programmed delay 204, a level shifter 206, and inverters 208, 210, and 212. A forward path signal may be conveyed from state machine 203 to a gate of FET M1 via forward path 202. Further, an output of inverter 212 is coupled to a gate of FET M1, which may comprise a positive channel field-effect transistor (PFET). Further, voltage regulator 200 includes a feedback path 214 coupled to the gate of FET M1 and including an inverter 216, a level shifter 218, and a controller 220. Switching voltage regulator 200 may further include an inductor L, a capacitor C, and may be configured for generation an output $V_{output}$. Each of FET M1 and FET M2 may also be referred to herein as a "switching element."

Voltage regulator 200 also includes a forward path 222 including state machine 203, a programmed delay 224, a level shifter 226, and inverters 228, 230, and 232. Another forward path signal may be conveyed from state machine 203 to a gate of FET M2 via forward path 222. Moreover, an output of inverter 232 is coupled to a gate of FET M2, which may comprise a negative channel field-effect transistor (NFET). Further, voltage regulator 200 includes a feedback path 234 coupled to the gate of FET M2 and including an inverter 236, a level shifter 238, and controller 220. As described more fully below, controller 220 may be configured to measure a delay between feedback signals feedback signals (i.e., P-FET_FB and N-FET_FB) and, in response thereto, convey signals to programmed delay 204 and/or programmed delay 224.

During a contemplated operation, state machine 203 may be configured to receive a signal GateDrive and convey a signal P_ON to programmed delay 204 of forward path 202 and a signal N_ON to programmed delay 224 of forward path 222. Programmed delay 204 is configured to program a delay into the forward path signal (i.e., in response to a signal from controller 220) of forward path 200, if necessary, and convey the forward path signal to level shifter 206, which may convert a voltage level of the forward path signal to another voltage level. Further, the forward path signal may be conveyed through inverters 208, 210, and 212 to generate gate voltage P_Gate, which is applied to a gate of FET M1. Further, gate voltage P_Gate may be conveyed through inverter 216 to level shifter 218, which is configured to convey feedback signal P-FET_FB to controller 220.

Moreover, programmed delay 224 is configured to program a delay into the forward path signal (i.e., in response to a signal from controller 220) of forward path 222, if necessary, and convey the forward path signal to level shifter 226, which may convert a voltage level of the forward path signal to another voltage level. Further, the forward path signal may be conveyed through inverters 228, 230, and 232 to generate gate voltage N_Gate, which is applied to a gate of FET M1. Further, gate voltage N_Gate may be conveyed through inverter 236 to level shifter 238, which is configured to conveys feedback signal N-FET_FB to controller 220.

Controller 220, in response to receiving feedback signals (i.e., P-FET_FB and N-FET_FB), is configured to measure for "overlaps" and "non-overlaps" of signals associated with the FETs M1 and M2, and adjust (i.e., delay) one or more of gate voltages P_Gate, which is applied to the gate of FET M1 and N_Gate, which is applied to the gate of FET M2. It is noted that switching voltage regulator 200 may configured to measure for overlaps and non-overlaps for each P-to-N transition and each N-to-P transition, and measurements may be continually made, as timing may vary with one or more operating conditions (e.g., voltage and temperature).

A P-to-N transition "overlap" occurs when the rising edge of a gate voltage N_Gate (i.e., voltage applied to FET M2)

occurs before the rising edge of a gate voltage P_Gate (i.e., voltage applied to FET M1). A P-to-N transition "overlap" can be reduced or eliminated by delaying the rising edge of gate voltage N_Gate. A P-to-N transition "non-overlap" occurs when the rising edge of gate voltage N_Gate occurs after the rising edge of gate voltage P_Gate. A P-to-N transition "non-overlap" can be reduced or eliminated by delaying the rising edge of gate voltage P_Gate. An N-to-P transition "overlap" occurs when the falling edge of gate voltage P_Gate occurs before the falling edge of gate voltage N_Gate. An N-to-P transition "overlap" can be reduced or eliminated by delaying the falling edge of gate voltage P_Gate. An N-to-P transition "non-overlap" occurs when the falling edge of gate voltage P_Gate occurs after the falling edge of N_Gate. An N-to-P transition "non-overlap" can be reduced or eliminated be delaying the falling edge of gate voltage N_Gate.

Figure 6:
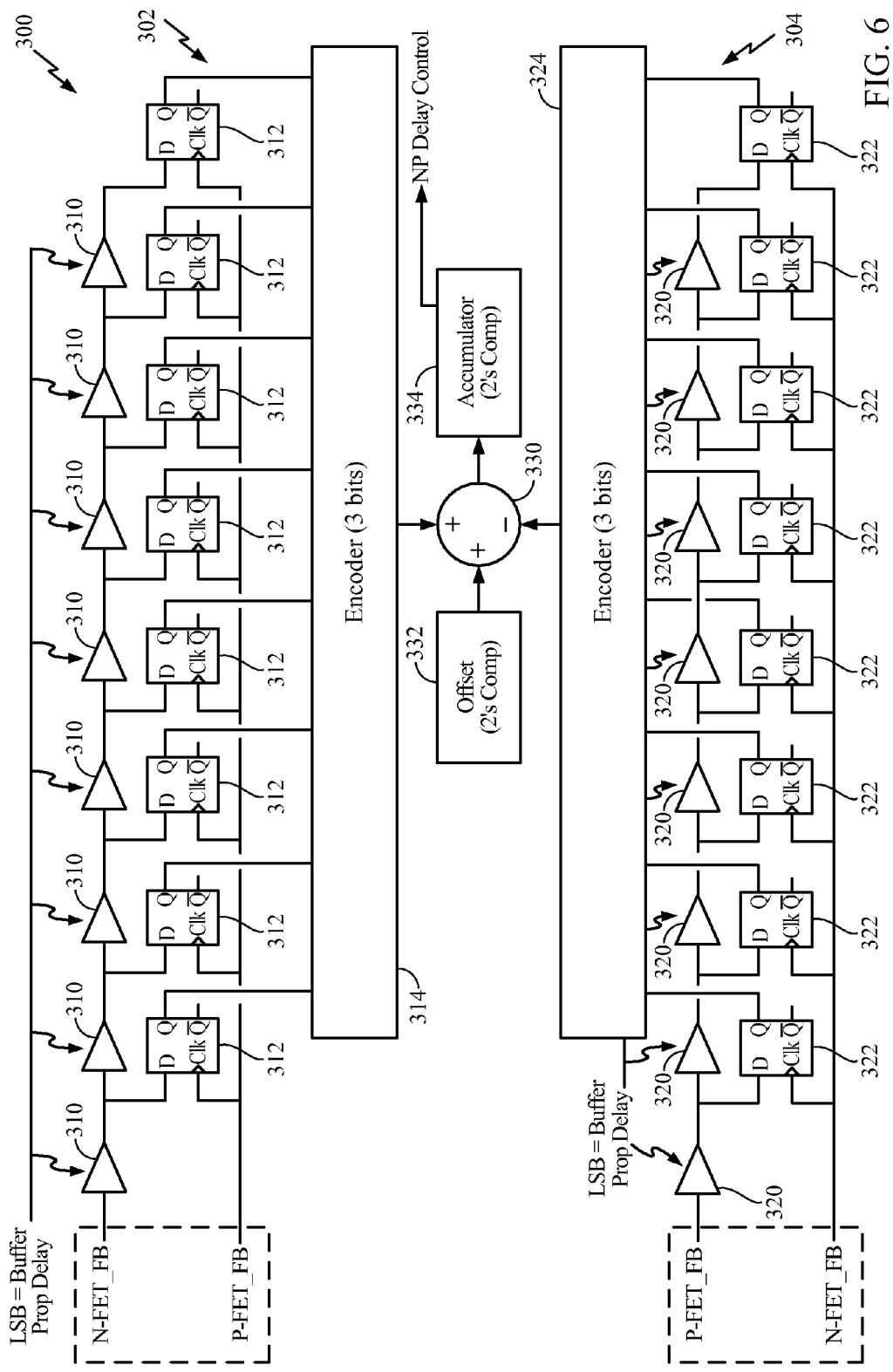
FIG. 6 depicts an N-to-P measurement unit of a controller, in accordance with an exemplary embodiment of the present invention.

FIG. 6 depicts a measurement unit 300, according to an exemplary embodiment of the present invention. Measurement unit 300, which may be part of non-overlap controller 220 (see FIG. 5), may be configured to measure an amount of N-to-P overlap of a voltage regulator, if any, and an amount of N-to-P non-overlap of the voltage regulator, if any. Measurement unit 300 includes an overlap unit 302 configured for measuring an amount of N-to-P overlap and a non-overlap unit 304 configured for measuring an amount of N-to-P non-overlap. Overlap unit 302 is configured to receive feedback signals N-FET_FB and P-FET_FB and includes a plurality of buffers 310, a plurality of latches 312, and an encoder 314. Non-overlap unit 304 is configured to receive feedback signals P-FET_FB and N-FET_FB and includes a plurality of buffers 320, a plurality of latches 322, and an encoder 324.

During operation, if a rising edge of N-FET_FB arrives at measurement unit 300 before an associated rising edge of P-FET_FB, then an N-to-P overlap is measured via overlap unit 302. More specifically, assuming the rising edge of feedback signal N-FET_FB arrives before an associated rising edge of feedback signal P-FET_FB, as feedback signal N-FET_FB is received, feedback signal N-FET_FB may propagate through one or more of buffers 310, and upon receipt of feedback signal P-FET_FB, feedback signals P-FET_FB and N-FET_FB may be latched to determine a delay value between the rising edge of feedback signal N-FET_FB and the associated rising edge of feedback signal P-FET_FB. It is noted that encoder 314 may generate a digital delay value representing the delay between the rising edge of feedback signal N-FET_FB and the associated rising edge of feedback signal P-FET_FB. The delay value may be conveyed to summer 330 via encoder 314. It is noted that if a delay value of a measured overlap is less than a buffer propagation delay (e.g., 250 picoseconds), then no delay is recorded.

If the rising edge of feedback signal N-FET_FB does not arrive before the associated rising edge of feedback signal P-FET_FB, an N-to-P non-overlap is measured via non-overlap unit 304. More specifically, assuming the rising edge of feedback signal N-FET_FB does not arrive before an associated rising edge of feedback signal P-FET_FB, as feedback signal P-FET_FB is received, feedback signal P-FET_FB may propagate through one or more buffers 320, and upon receipt of feedback signal N-FET_FB, feedback signals P-FET_FB and N-FET_FB may be latched to determine a delay value between the rising edge of feedback signal P-FET_FB and the associated rising edge of feedback signal N-FET_FB. It is noted that encoder 324 may generate a digital delay value representing the delay between the rising edge of feedback signal P-FET FB and the associated rising edge of feedback signal N-FET_FB. The delay value may be conveyed to summer 330 via encoder 324. It is further noted that if a delay value of a measured non-overlap is less than a buffer propagation delay (e.g., 250 picoseconds), then no delay is recorded.

Measurement unit 300 further includes an offset unit 332, which may configured to convey a either a positive offset value or a negative offset value to summer 330. A positive offset value may force additional non-overlap for an N-to-P transition. A negative offset value may force additional overlap for an N-to-P transition. Summer 330 may be configured to summer an offset values with a delay value received from either encoder 314 or encoder 324 and convey a signal to an accumulator 334. A positive accumulator delays a rising edge of the forward path signal conveyed to FET M2 and a negative accumulator delays a rising edge of the forward path signal conveyed to FET M1. Accumulator 334 may allow for cycle value of measurement unit 300 to be smaller than the programmed delay. For example, if measurement unit 300 includes four (4) 250 ps delay cells, any one cycle would only be able to measure 1 ns of overlap or non-overlap. Accordingly, if 2.6 ns of overlap exists, during a first cycle, measurement unit 300 may measure four (4) and delay by four (4) (i.e., 1 ns). During a second cycle, measurement unit 300 may measure four (4) and delay by 4+4 (i.e., 2 ns). During a third cycle measurement unit 300 may measure three (3) and delay by 4+4+3. (i.e., 2.75 ns). During a fourth cycle, measurement unit may measure zero (0). Therefore, the accumulator value would be equal to eleven (11) and the programmed delay would be equal to 2.75 ns.

Figure 7:
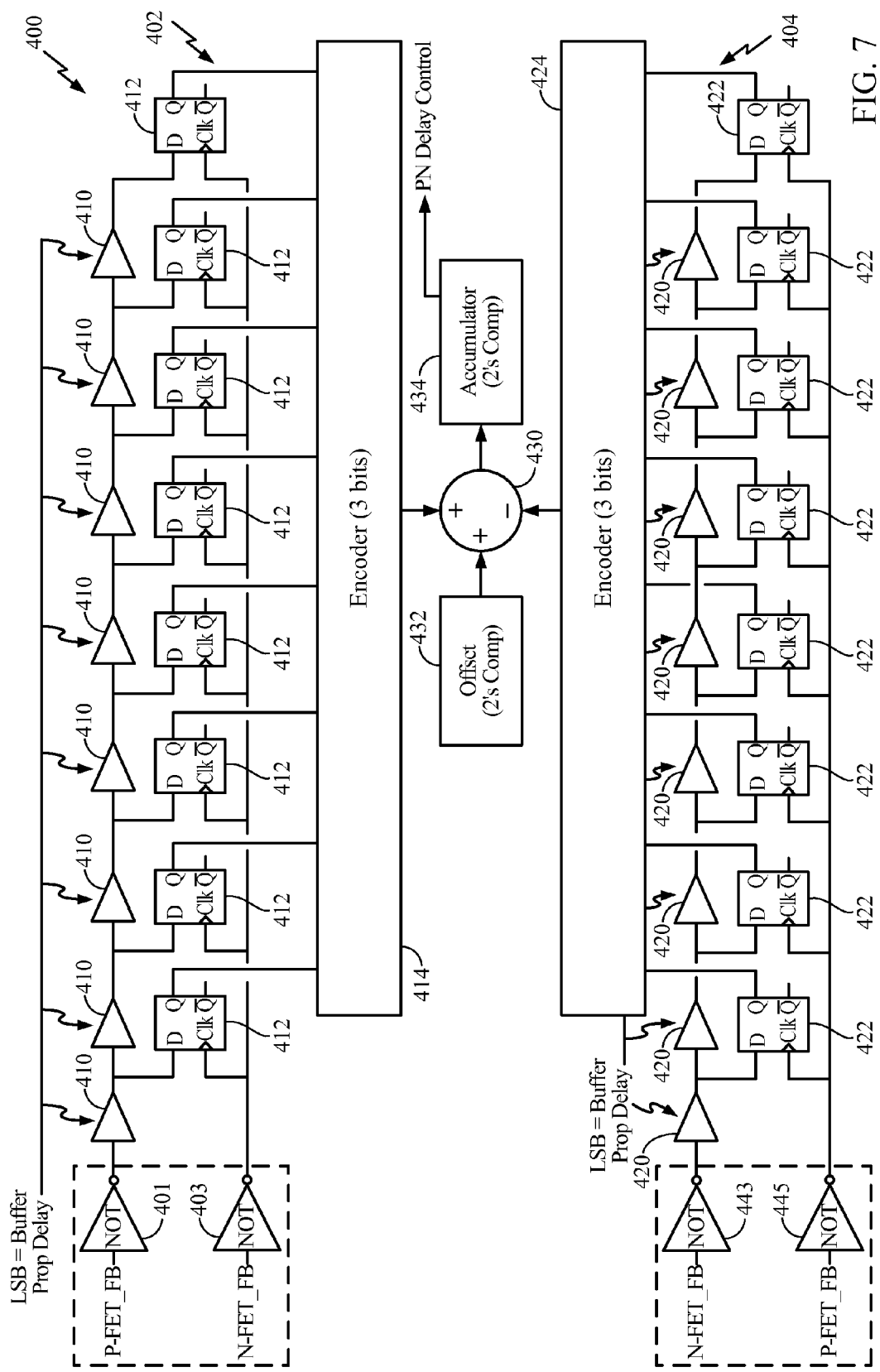
FIG. 7 depicts a P-to-N measurement unit of a controller, in accordance with an exemplary embodiment of the present invention.

FIG. 7 depicts another measurement unit 400, according to an exemplary embodiment of the present invention. Measurement unit 400, which may be part of non-overlap controller 220 (see FIG. 5), may be configured to measure an amount of P-to-N overlap of a voltage regulator, if any, and an amount of P-to-N non-overlap of the voltage regulator, if any. Measurement unit 400 includes an overlap unit 402 configured for measuring an amount of P-to-N overlap and a non-overlap unit 404 configured for measuring an amount of P-to-N non-overlap. Overlap unit 402 is configured to receive feedback signals N-FET_FB and P-FET_FB and includes inverters 401 and 403, a plurality of buffers 410, a plurality of latches 412, and an encoder 414. Non-overlap unit 404 is configured to receive feedback signals P-FET_FB and N-FET_FB and includes inverters 443 and 445, a plurality of buffers 420, a plurality of latches 422, and an encoder 424.

During operation, if a falling edge of feedback signal P-FET_FB arrives before an associated falling edge of feedback signal N-FET_FB, then a P-to-N overlap is measured via overlap unit 402. More specifically, assuming the falling edge of feedback signal P-FET_FB arrives before an associated falling edge of feedback signal N-FET_FB, as feedback signal P-FET_FB is received, feedback signal P-FET_FB may propagate through one or more of buffers 410, and upon receipt of feedback signal N-FET_FB, feedback signals P-FET_FB and N-FET_FB may be latched to determine a delay value between the falling edge of feedback signal P-FET_FB and the associated falling edge of feedback signal N-FET_FB. It is noted that encoder 414 may generate a digital delay value representing the delay between the falling edge of feedback signal P-FET_FB and the associated falling edge of feedback signal N-FET_FB. The delay value may be conveyed to summer 430 via encoder 414. It is further noted that if a delay value of a measured overlap is less than a buffer propagation delay (e.g., 250 picoseconds), then no delay is recorded.

If the falling edge of a P-FET_FB does not arrive before an associated falling edge of N-FET_FB, a P-to-N non-overlap is measured via non-overlap unit 404. More specifically, assuming the falling edge of a feedback signal P-FET_FB does not arrive before an associated falling edge of feedback signal N-FET_FB, as feedback signal N-FET FB is received, feedback signal N-FET_FB may propagate through one or more buffers 420, and upon receipt of feedback signal P-FET_FB, feedback signals P-FET_FB and N-FET_FB may be latched to determine a delay value between the falling edge of feedback signal N-FET_FB and the associated falling edge of feedback signal P-FET_FB. It is noted that encoder 414 may generate a digital delay value representing the delay between the falling edge of feedback signal N-FET_FB and the associated falling edge of feedback signal P-FET_FB. The delay value may be conveyed to summer 330 via encoder 424. It is further noted that if a delay value of a measured non-overlap is less than a buffer propagation delay (e.g., 250 picoseconds), then no delay is recorded.

Measurement unit 400 further includes an offset unit 432, which may configured to convey a either a positive offset value or a negative offset value to summer 430. A positive offset value may force additional non-overlap for a P-to-N transition. A negative offset value may force additional overlap for a P-to-N transition. Summer 330 may be configured to summer an offset values with a delay value received from either encoder 414 or encoder 424 and convey a signal to an accumulator 434. A positive accumulator delays a falling edge of P-FET and a negative accumulator delays a falling edge of N-FET. Accumulator 434 may allow for cycle value of measurement unit 400 to be smaller than the programmed delay. For example, if measurement unit 400 includes four (4) 250 ps delay cells, any one cycle would only be able to measure ins of overlap or non-overlap. Accordingly, if 2.6 ns of overlap exists, during a first cycle, measurement unit 400 may measure four (4) and delay by four (4) (i.e., ins). During a second cycle, measurement unit 400 may measure four (4) and delay by 4+4 (i.e., 2 ns). During a third cycle measurement unit 400 may measure three (3) and delay by 4+4+3. (i.e., 2.75 ns). During a fourth cycle, measurement unit may measure zero (0). Therefore, the accumulator value would be equal to eleven (11) and the programmed delay would be equal to 2.75 ns.

Figure 8:
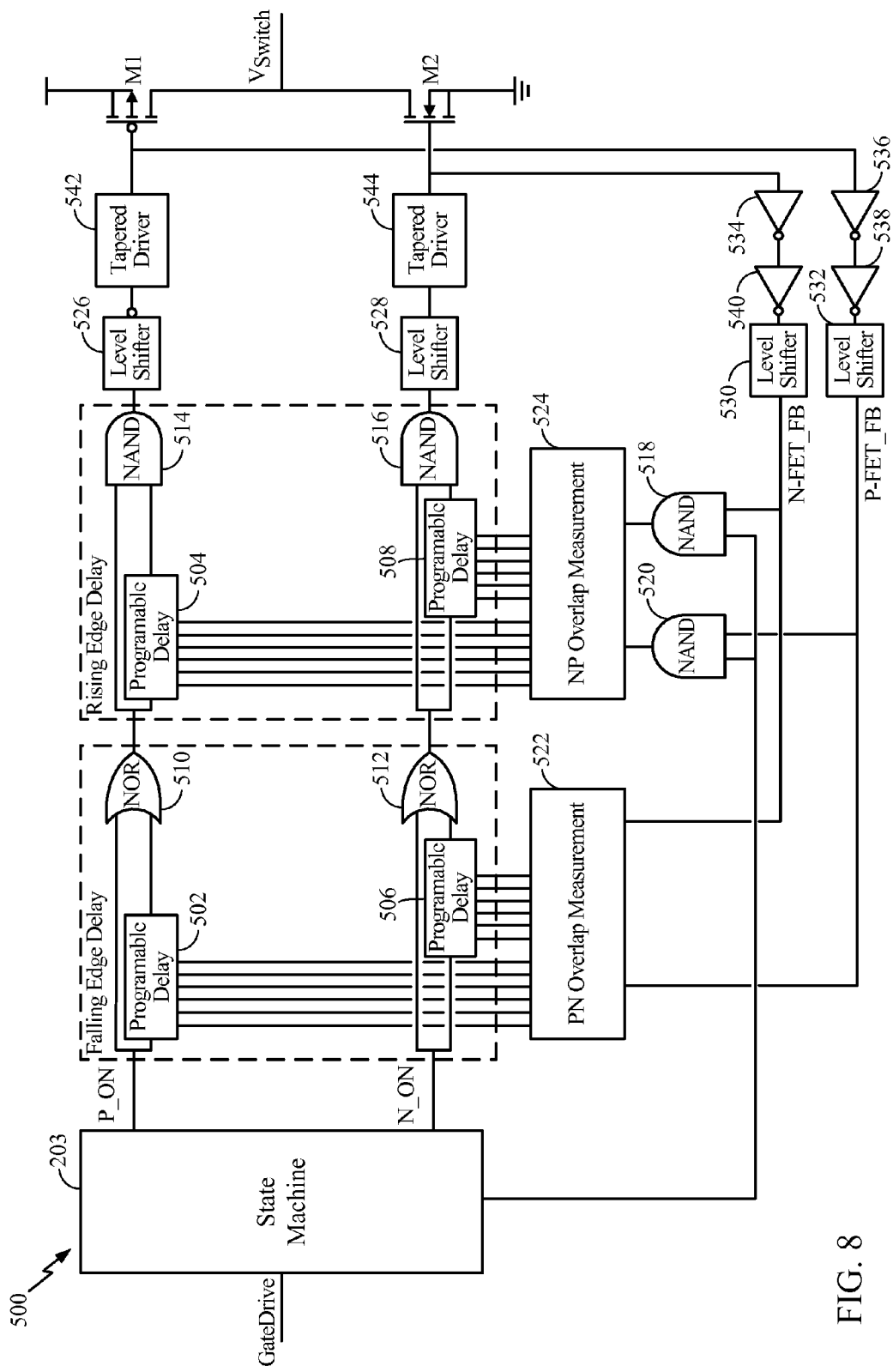
FIG. 8 depicts another switching voltage regulator, in accordance with an exemplary embodiment of the present invention.

FIG. 8 is another illustration of a switching voltage regulator 500, according to an embodiment of the invention. Switching voltage regulator 500 includes state machine 203, programmable delay units 502, 504, 506, and 508, NOR gates 510 and 512, NAND gates 514, 516, 518, and 520, P-to-N overlap measurement unit 522, N-to-P overlap measurement unit 524, level shifters 526, 528, 530, and 532, inverters 534, 536, 538, and 540, tapered drivers 542 and 544, and FETs M1 and M2. It is noted that switching voltage regulator 500 may comprise switching voltage regulator 200 (see FIG. 5) wherein programmable delay units 502, 504, 506, and 508, NOR gates 510 and 512, NAND gates 514, 516, 518, and 520, P-to-N overlap measurement unit 522, and N-to-P overlap measurement unit 524, as illustrated in switching voltage regulator 500, are part of controller 220 of switching voltage regulator 200.

During a contemplated operation of switching voltage regulator 500, P-to-N overlap measurement unit 522 may be configured to receive feedback signals P-FET_FB and N-FET_FB and measure any P-to-N overlap or P-to-N non-overlap that may exist. Further, in the event that either a P-to-N overlap or a P-to-N non-overlap exists, a delay may be inserted into the forward path signal that is conveyed to FET M1 via programmable delay unit 502 or the forward path signal that is conveyed to FET M2 via programmable delay unit 506. In addition, N-to-P overlap measurement unit 524 may be configured to receive feedback signals P-FET_FB and N-FET_FB and measure any N-to-P overlap or N-to-P non-overlap that may exist. Further, in the event that either an N-to-P overlap or an N-to-P non-overlap exists, a delay may be inserted into the forward path signal that is conveyed to FET M1 via programmable delay unit 504 or the forward path signal that is conveyed to FET M2 via programmable delay unit 508.

Switching voltage regulator 500 may be configured to prevent a negative inductor current (i.e., a current supplied from the FET M2). Accordingly, a tri-state condition may occur. For example, FET M1 is ON, FET M2 is switched ON and stays ON until the inductor current reaches zero (0). FET M2 is then switched off before the end of the cycle, and FET M1 does not switch ON until the beginning of the next cycle. Any measurement here does not include real N-to-P non-overlap and, therefore it must be ignored. NAND gates 518 and 520 force a measurement of zero, which produces no adjustment of the delay setting.

Figure 9:
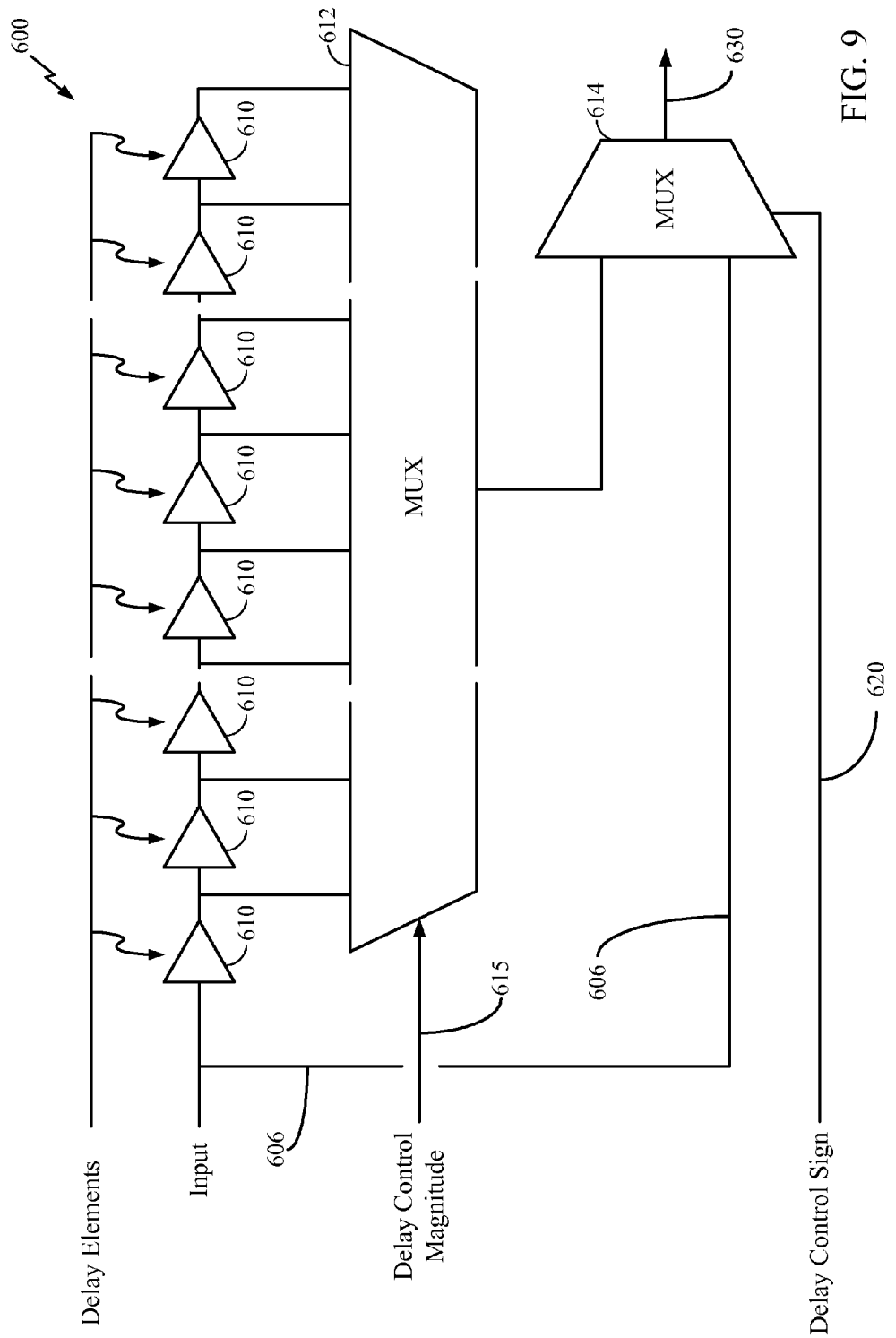
FIG. 9 depicts a programmable delay unit, according to an exemplary embodiment of the present invention.

It is noted that each of programmable delay units 502, 504, 506, and 508 may comprise programmable delay unit 600 illustrated in FIG. 9. With reference to FIG. 9, programmable delay unit 600 includes a plurality of buffers 610 configured to receive an input signal 606, a multiplexer 612 coupled to an output of each buffer 610 and configured to receive a delay control magnitude signal 615. Programmable delay unit 600 may further include a multiplexer 614 configured to receive an output of multiplexer 612, input signal 606, and a delay control signal 620, and output a delay 630. During operation, multiplexer 612 may be configured to select a number of delay elements that signal 606 will pass through (i.e., the length of the delay). Buffers 610 are matched to the delay of the measurement buffers 310 and 410. Multiplexer 614 may be configured to select zero for non-overlaps and the output of multiplexer 612 for overlaps.

Figure 10:
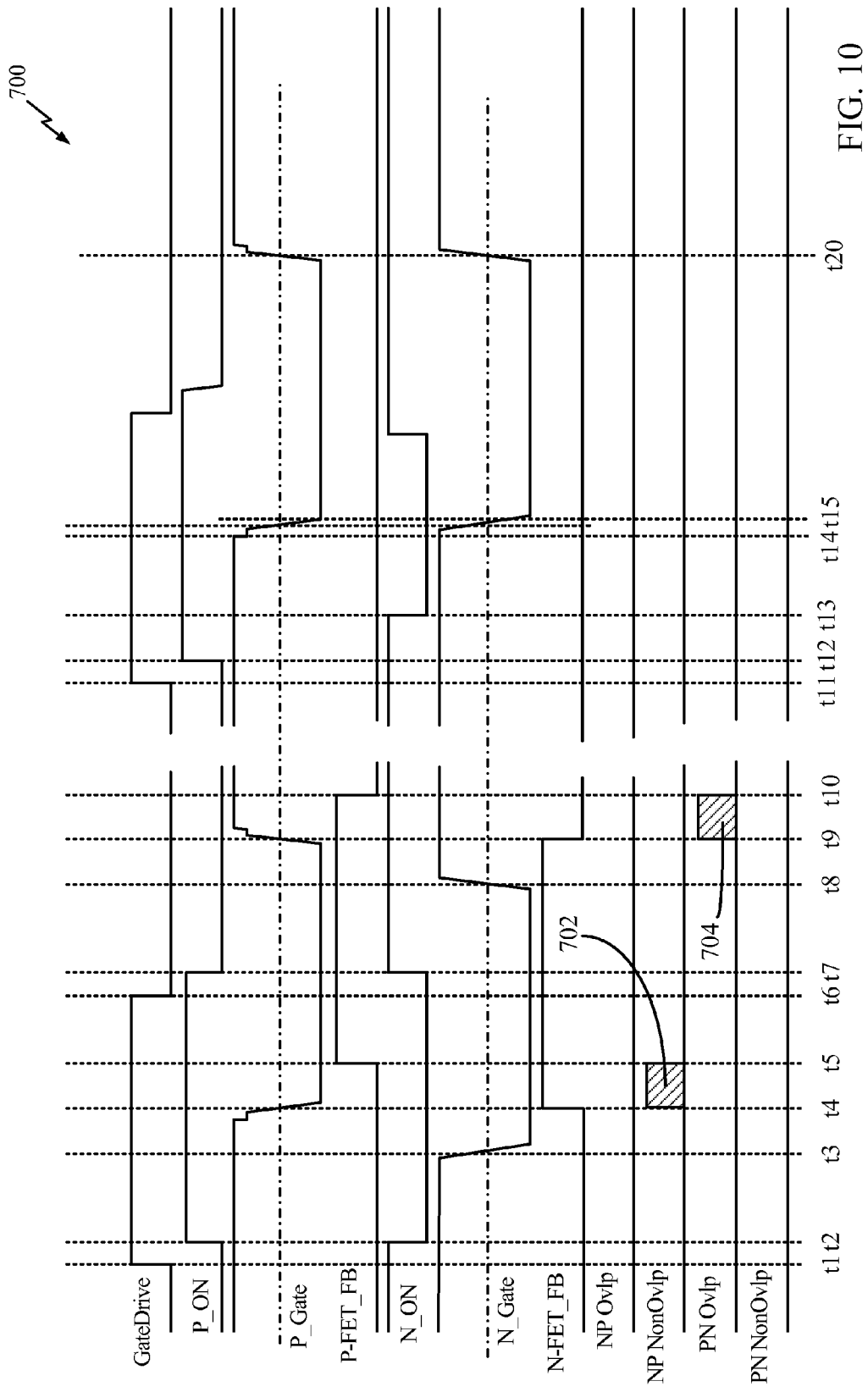
FIG. 10 depicts a timing diagram associated with the switching voltage regulator of FIG. 5.

FIG. 10 is a timing diagram 700 illustrating states of various signals during operation of switching voltage regulator 200 (see FIG. 5). As illustrated in timing diagram 700, beginning approximately at time t3 through time t4, an N-to-P non-overlap occurs (i.e., both FETS M1 and M2 are OFF). It is noted that a rising edge of feedback signal P-FET_FB is delayed with respect to an associated rising edge of feedback signal N-FET_FB by a delay period 702. Further, beginning approximately at time t8 through approximately time t9 a P-to-N overlap occurs (i.e., both FETS M1 and M2 are ON). It is noted that a falling edge of feedback signal P-FET_FB is delayed with respect to an associated falling edge of feedback signal N-FET_FB by a delay period 704. Furthermore, with reference to times t14-t15, the N-to-P non-overlap, which previously existed between time t3 and time t4 has been corrected. In addition, with reference to time t20, the P-to-N overlap, which previously existed between times t8 and t9, has been corrected. It is noted that a small, negligible error (i.e., delay) may still exist between signals after dynamically adjusting one or more signals for correction overlaps and/or non-overlaps.

Figure 11:
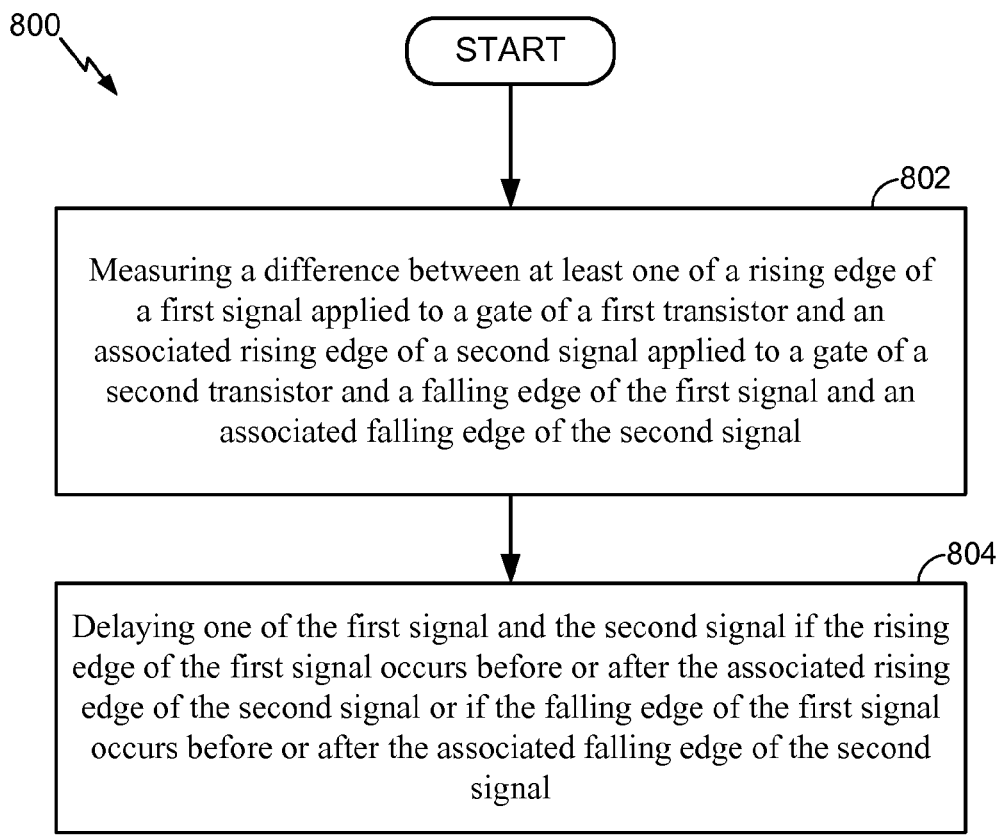
FIG. 11 is a flowchart illustrating a method, according to an exemplary embodiment of the present invention.

FIG. 11 is a flowchart illustrating a method 800, in accordance with one or more exemplary embodiments. Method 800 may include measuring a difference between at least one of a rising edge of a first signal applied to a gate of a first transistor and an associated rising edge of a second signal applied to a gate of a second transistor and a falling edge of the first signal and an associated falling edge of the second signal (depicted by numeral 802). Method 800 may also include delaying one of the first signal and the second signal if the rising edge of the first signal occurs before or after the associated rising edge of the second signal or if the falling edge of the first signal occurs before or after the associated falling edge of the second signal (depicted by numeral 804).

Figure 12:
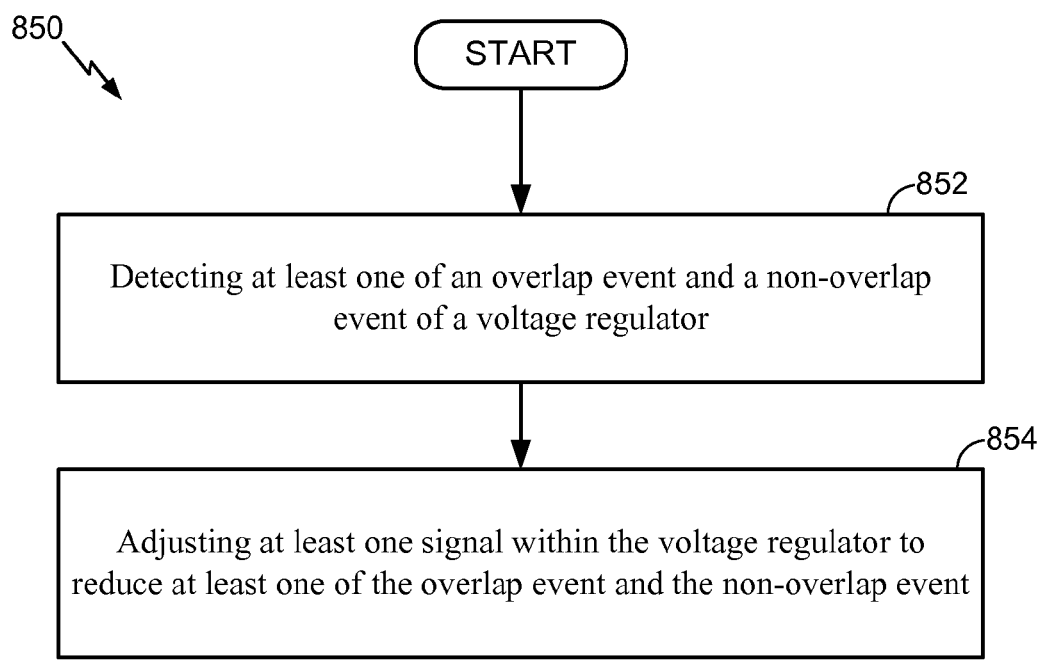
FIG. 12 is a flowchart illustrating another method, according to an exemplary embodiment of the present invention.

FIG. 12 is a flowchart illustrating a method 850, in accordance with one or more exemplary embodiments. Method 850 may include detecting at least one of an overlap event and a non-overlap event of a voltage regulator (depicted by numeral 852). Method 850 may also include adjusting at least one signal within the voltage regulator to reduce at least one of the overlap event and the non-overlap event (depicted by numeral 854).

Figure 13:
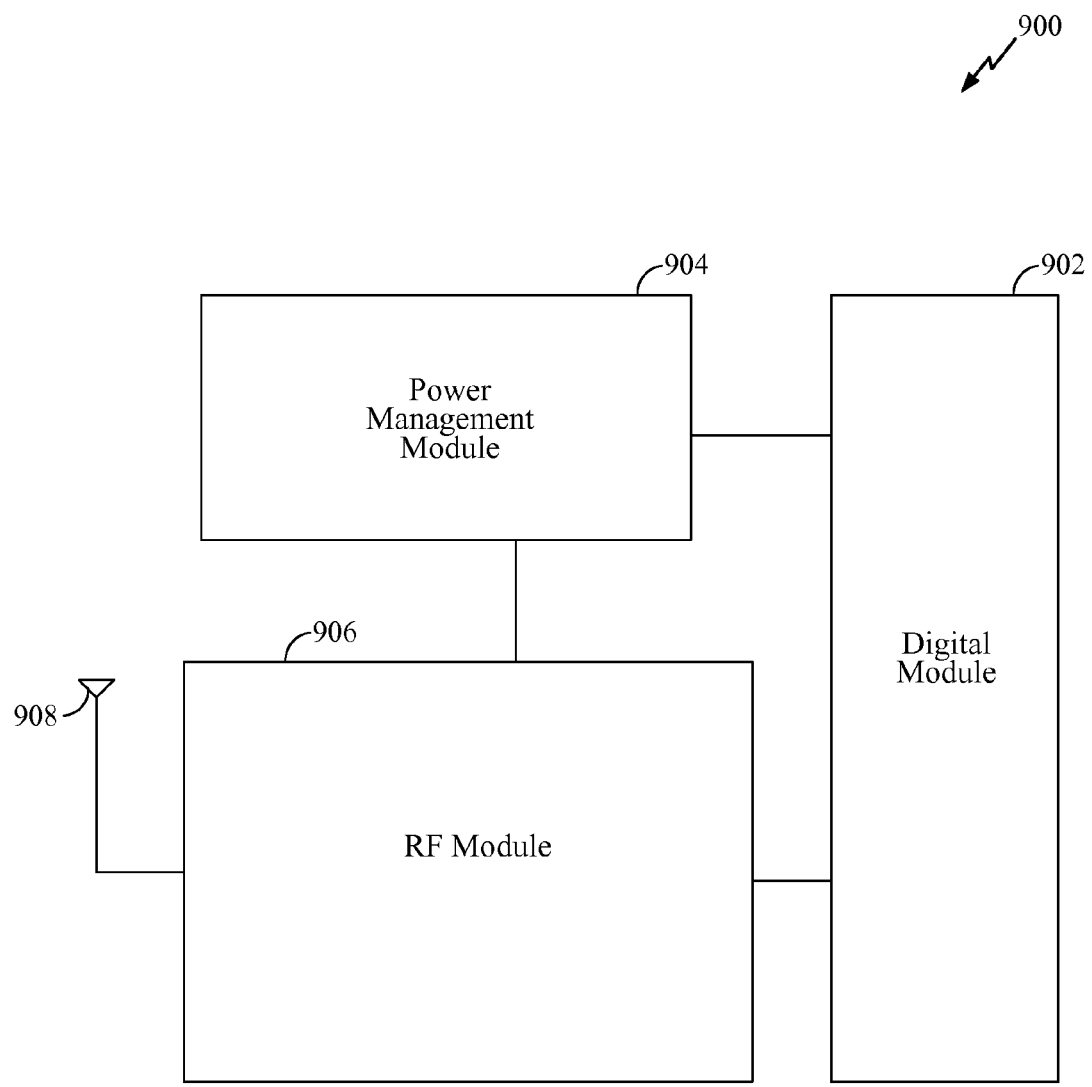
FIG. 13 illustrates a system including a voltage regulator, in accordance with an exemplary embodiment of the present invention.

FIG. 13 is a block diagram of a wireless communication device 900. In this exemplary design, wireless communication device 900 includes digital module 904, an RF module 906, and power management module 904. Digital module 204 may comprise memory and one or more processors. RF module 906, which may comprise a radio-frequency integrated circuit (RFIC) may include a transceiver including a transmitter and a receiver and may be configured for bi-directional wireless communication via an antenna 908. In general, wireless communication device 900 may include any number of transmitters and any number of receivers for any number of communication systems, any number of frequency bands, and any number of antennas. Further, power management module 904 may include one or more voltage regulators, such as voltage regulators 200 and 500 illustrated in FIGS. 5 and 8.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
    a first transistor having a gate configured to receive a first signal;
    a second transistor having a gate configured to receive a second signal; and
    a controller configured to:
    measure at least one of a difference between a rising edge of the first signal and an associated rising edge of the second signal and a difference between a falling edge of the first signal and an associated falling edge of the second signal; and
    delay one of the first signal and the second signal if the rising edge of the first signal occurs before or after the associated rising edge of the second signal or if the falling edge of the first signal occurs before or after the associated falling edge of the second signal.

2. The device of claim 1, wherein the first transistor comprises a positive channel field-effect transistor (PFET).

3. The device of claim 1, wherein the second transistor comprises a negative channel field-effect transistor (NFET).

4. A device, comprising:
    a first transistor having a gate configured to receive a first signal;

a second transistor having a gate configured to receive a second signal;
a controller configured to:
measure at least one of a difference between a rising edge of the first signal and an associated rising edge of the second signal and a difference between a falling edge of the first signal and an associated falling edge of the second signal, and
delay one of the first signal and the second signal if the rising edge of the first signal occurs before or after the associated rising edge of the second signal or if the falling edge of the first signal occurs before or after the associated falling edge of the second signal;
a first forward path including a first programmable delay unit and configured for conveying the first signal to the first transistor;
a first feedback path coupled to the first forward path and including the controller configured to receive a first feedback signal based on the first signal;
a second forward path including a second programmable delay unit and configured for conveying the second signal to the second transistor; and
a second feedback path coupled to the second forward path and including the controller configured to receive a second feedback signal based on the second signal.

5. The device of claim 4, the controller configured to convey a delay value to at least one of the first programmable delay unit and the second programmable delay unit.

6. The device of claim 1, further comprising:
a first programmable delay unit coupled to the controller and configured for delaying the first signal; and
a second programmable delay unit coupled to the controller and configured for delaying the second signal.

7. A device, comprising:
a first transistor having a gate configured to receive a first signal;
a second transistor having a gate configured to receive a second signal;
a controller configured to:
measure at least one of a difference between a rising edge of the first signal and an associated rising edge of the second signal and a difference between a falling edge of the first signal and an associated falling edge of the second signal, and
delay one of the first signal and the second signal if the rising edge of the first signal occurs before or after the associated rising edge of the second signal or if the falling edge of the first signal occurs before or after the associated falling edge of the second signal;
an N-to-P non-overlap unit for measuring an amount of N-to-P non-overlap between the first and second signal;
an N-to-P overlap unit for measuring an amount of N-to-P overlap between the first and second signal;
a P-to-N non-overlap unit for measuring an amount of P-to-N non-overlap between the first and second signal; and
a P-to-N overlap unit for measuring an amount of P-to-N overlap between the first and second signal.

8. The device of claim 7, wherein each of the N-to-P non-overlap unit, the N-to-P overlap unit, the P-to-N non-overlap unit, and the P-to-N overlap unit includes a plurality of buffers, a plurality of latches coupled to the plurality of buffers, and an encoder for generating a delay value representing an amount of overlap or non-overlap between the first and second signal.

9. The device of claim 1, wherein the controller configured to measure at least one of a difference between a rising edge of the first signal and an associated rising edge of the second signal and a difference between a falling edge of the first signal and an associated falling edge of the second signal during each P-to-N transition and each N-to-P transition.

10. The device of claim 1, the controller configured to:
delay a rising edge of the second signal if the rising edge of the second signal occurs before an associated rising edge of the first signal;
delay a rising edge of the first signal if an associated rising edge of the second signal occurs after the rising edge of the first signal;
delay a falling edge of the first signal if the falling edge of the first signal occurs before an associated falling edge of the second signal; and
delay a falling edge of the second signal if an associated falling edge of the first signal occurs after the falling edge of the second signal.

11. A method, comprising:
measuring a difference between at least one of a rising edge of a first signal applied to a gate of a first transistor and an associated rising edge of a second signal applied to a gate of a second transistor and a falling edge of the first signal and an associated falling edge of the second signal; and
delaying one of the first signal and the second signal if the rising edge of the first signal occurs before or after the associated rising edge of the second signal or if the falling edge of the first signal occurs before or after the associated falling edge of the second signal.

12. The method of claim 11, wherein measuring a difference comprises measuring a difference between at least one of the rising edge of the first signal applied to a gate of a positive channel field-effect transistor (PFET) and the associated rising edge of the second signal applied to a gate of a negative channel field-effect transistor (NFET) and a falling edge of the first signal and an associated falling edge of the second signal.

13. The method of claim 11, wherein delaying one of the first signal and the second signal comprises one of delaying the first signal with a first programmable delay unit and delaying the second signal with a second programmable delay unit.

14. The method of claim 11, wherein measuring comprises measuring at least one of the difference between the rising edge of the first signal and the associated rising edge of the second signal and the difference between the falling edge of the first signal and the associated falling edge of the second signal during each P-to-N transition and each N-to-P transition.

15. The method of claim 11, wherein delaying comprises:
delaying a rising edge of the second signal if the rising edge of the second signal occurs before an associated rising edge of the first signal;
delaying a rising edge of the first signal if an associated rising edge of the second signal occurs after the rising edge of the first signal;
delaying a falling edge of the first signal if the falling edge of the first signal occurs before an associated falling edge of the second signal; and
delaying a falling edge of the second signal if an associated falling edge of the first signal occurs after the falling edge of the second signal.

16. A device, comprising:
means for measuring a difference between at least one of a rising edge of a first signal applied to a gate of a first transistor and an associated rising edge of a second signal applied to a gate of a second transistor and a falling edge of the first signal and an associated falling edge of the second signal; and means for delaying one of the first signal and the second signal if the rising edge of the first signal occurs before or after the associated rising edge of the second signal or if the falling edge of the first signal occurs before or after the associated falling edge of the second signal.

17. A method, comprising:

measuring a difference between at least one of a rising edge of a first signal applied to a gate of a first transistor and an associated rising edge of a second signal applied to a gate of a second transistor and a falling edge of the first signal and an associated falling edge of the second signal;

delaying one of the first signal and the second signal if the rising edge of the first signal occurs before or after the associated rising edge of the second signal or if the falling edge of the first signal occurs before or after the associated falling edge of the second signal;

conveying the first signal to the first transistor via a first forward path including a first programmable delay unit;

receiving a first feedback signal based on the first signal via a first feedback path coupled to the first forward path for the measuring the difference and the delaying the one of the first signal and the second signal;

conveying the second signal to the second transistor via a second forward path including a second programmable delay unit;

receiving a second feedback signal based on the second signal via a second feedback path coupled to the second forward path for the measuring the difference and the delaying the one of the first signal and the second signal.

18. The method of claim 17, further comprises conveying a delay value to at least one of the first programmable delay unit and the second programmable delay unit.

19. A method, comprising:

measuring a difference between at least one of a rising edge of a first signal applied to a gate of a first transistor and an associated rising edge of a second signal applied to a gate of a second transistor and a falling edge of the first signal and an associated falling edge of the second signal;

delaying one of the first signal and the second signal if the rising edge of the first signal occurs before or after the associated rising edge of the second signal or if the falling edge of the first signal occurs before or after the associated falling edge of the second signal;

measuring an amount of N-to-P non-overlap between the first and second signal;

measuring an amount of N-to-P overlap between the first and second signal;

measuring an amount of P-to-N non-overlap between the first and second signal; and measuring an amount of P-to-N overlap between the first and second signal.

20. The method of claim 19, wherein each of the measuring the amount of N-to-P non-overlap between the first and second signal;

the measuring the amount of N-to-P overlap between the first and second signal;

the measuring the amount of P-to-N non-overlap between the first and second signal; and the measuring the amount of P-to-N overlap between the first and second signal is measured with a plurality of buffers, a plurality of latches coupled to the plurality of buffers, and an encoder for generating a delay value representing an amount of overlap or non-overlap between the first and second signal.

* * * * *